United States Patent
Rotondaro et al.

(10) Patent No.: US 6,979,623 B2
(45) Date of Patent: Dec. 27, 2005

(54) METHOD FOR FABRICATING SPLIT GATE TRANSISTOR DEVICE HAVING HIGH-K DIELECTRICS

(75) Inventors: Antonio L. P. Rotondaro, Dallas, TX (US); Mark Robert Visokay, Richardson, TX (US); James J. Chambers, Dallas, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/738,957

(22) Filed: Dec. 17, 2003

(65) Prior Publication Data

US 2005/0136632 A1 Jun. 23, 2005

(51) Int. Cl.⁷ .......................................... H01L 21/336
(52) U.S. Cl. .................. 438/287; 438/275; 438/785
(58) Field of Search ................. 438/275, 287, 438/766, 770, 785, 981, 308, 799

(56) References Cited

U.S. PATENT DOCUMENTS

| | | | |
|---|---|---|---|
| 6,103,566 A * | 8/2000 | Tamaru et al. | 438/240 |
| 6,352,905 B1 * | 3/2002 | Gauthier et al. | 438/404 |
| 6,358,818 B1 * | 3/2002 | Wu | 438/431 |
| 6,432,776 B1 * | 8/2002 | Ono | 438/275 |
| 6,544,906 B2 | 4/2003 | Rotondaro et al. | |
| 6,555,436 B2 * | 4/2003 | Ramsbey et al. | 438/279 |
| 6,586,293 B1 * | 7/2003 | Hasegawa | 438/216 |
| 6,656,852 B2 | 12/2003 | Rotondaro et al. | |
| 6,787,421 B2 * | 9/2004 | Gilmer et al. | 438/275 |
| 2003/0129817 A1 | 7/2003 | Visokay et al. | |

* cited by examiner

Primary Examiner—Amir Zarabian
Assistant Examiner—Khanh Duong
(74) Attorney, Agent, or Firm—Jacqueline J. Garner; W. James Brady, III; Frederick J. Telecky, Jr.

(57) ABSTRACT

Methods and systems are disclosed that facilitate semiconductor fabrication by fabricating transistor devices having gate dielectrics with selectable thicknesses in different regions of semiconductor devices. The thicknesses correspond to operating voltages of the corresponding transistor devices. Furthermore, the present invention also provides systems and methods that can fabricate the gate dielectrics with high-k dielectric material, which allows a thicker gate dielectric than conventional silicon dioxide.

17 Claims, 11 Drawing Sheets

METHOD FOR FABRICATING SPLIT GATE TRANSISTOR DEVICE HAVING HIGH-K DIELECTRICS

FIELD OF INVENTION

The present invention relates generally to semiconductor devices and more particularly to methods for fabricating semiconductor devices with high-k dielectrics for split gate transistor technology.

BACKGROUND OF THE INVENTION

Field effect transistors (FETs) are widely used in the electronics industry for switching, amplification, filtering, and other tasks related to both analog and digital electrical signals. Most common among these are MOS transistors, in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) over a silicon wafer surface, with doped polysilicon formed over the $SiO_2$ to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, there are electrical and physical limitations on the extent to which thickness of $SiO_2$ gate dielectrics can be reduced. For example, very thin $SiO_2$ gate dielectrics are prone to large gate tunneling leakage currents resulting from direct tunneling through the thin gate oxide. In addition, there are conventional limitations on the ability to form such thin oxide films with uniform thickness. Furthermore, thin $SiO_2$ gate dielectric layers provide a poor diffusion barrier to dopants, for example, and may allow high boron dopant penetration into the underlying channel region of the silicon during fabrication of the source/drain regions.

Recent MOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

The performance of the resulting MOS transistors is dependent upon the high-k gate dielectric material, including the bulk high-k material and on a thickness or equivalent oxide thickness of deposited material. Unlike $SiO_2$, which may be formed by thermal oxidation (growth process), high-k dielectrics are typically deposited over the semiconductor substrate, using chemical vapor deposition (CVD), physical vapor deposition (PVD), atomic layer deposition (ALD), molecular beam epitaxy (MBE), or other deposition processes. While the macroscopic composition (e.g., stoichiometry) of these materials may be controlled to a certain extent during such deposition processes, stoichiometric composition variations within the film may degrade device performance.

The equivalent oxide thickness and choice of materials for dielectric layers MOS transistors is at least partially dependent upon expected operating voltages. Generally, a higher operating voltage requires a thicker equivalent oxide thickness. However, some semiconductor devices are formed that include MOS transistors that operate at different operating voltages, such as a lower operating voltage and a higher operating voltage. The transistors operating at the higher operating voltage require a thicker equivalent oxide layer than do the transistors operating at the lower operating voltage. As a result, all of the transistors are typically formed with the thicker equivalent oxide layer. Unfortunately, this results in degraded performance for the devices that do not require such a thick dielectric layer.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides systems and methods that facilitate semiconductor fabrication by fabricating transistor devices having gate dielectrics with selectable thicknesses in different regions of semiconductor devices. The thicknesses correspond to operating voltages of the corresponding transistor devices. Furthermore, the present invention also provides systems and methods that can fabricate the gate dielectrics with high-k dielectric material, which allows a thicker gate dielectric than conventional silicon dioxide.

The present invention fabricates transistor devices with varied gate dielectric thicknesses in a number of suitable methods and variations thereof. In one example, a dielectric layer is formed on a substrate in a core region and a periphery region. The dielectric layer can be comprised of silicon dioxide or a high-k dielectric material. Transistor devices within the core region are to operate at a relatively low voltage whereas transistor devices within the periphery region are to operate at a relatively high voltage. A portion of the dielectric layer is removed from the core region and a high-k dielectric layer is then formed over the device in both the core region and the periphery region. As a result, thicknesses, including equivalent oxide thicknesses, of gate dielectrics in the core region and the periphery region are distinct. Gate electrodes are then formed over the dielectric layers in both regions and standard fabrication can be performed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
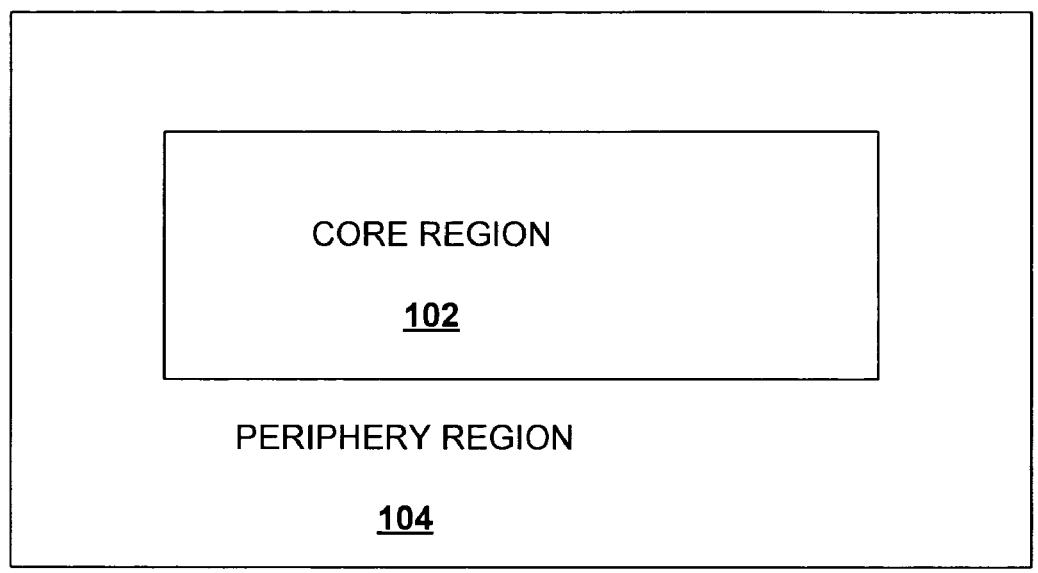
FIG. 1 is a block diagram of a semiconductor device in accordance with an aspect of the present invention.

One or more implementations of the present invention will now be described with reference to the attached drawings, wherein like reference numerals are used to refer to like elements throughout, and wherein the devices and structures illustrated in the figures are not necessarily drawn to scale.

The present invention provides systems and methods that facilitate semiconductor fabrication by fabricating transistor devices having gate dielectrics with selectable thicknesses in different regions of semiconductor devices. The thicknesses correspond to operating voltages of the corresponding transistor devices. Furthermore, the present invention also provides systems and methods that can fabricate the gate dielectrics with high-k dielectric material, which allows a thicker gate dielectric than conventional silicon dioxide.

Semiconductor devices can include transistor devices that operate at different voltages in different regions of the semiconductor device. Conventionally, transistor devices on a semiconductor device or die were formed with about the same gate dielectric thickness, which typically corresponded to a highest operating voltage. As a result, transistor devices operating at a relatively low operating voltage were fabricated with a thicker gate dielectric than necessary. This extra thickness can slow operation or speed of such devices. The present invention mitigates the extra thickness by providing for selectable thicknesses in multiple regions of such semiconductor devices. Accordingly, performance of the semiconductor device, particularly transistor devices within the semiconductor device that operate at a relatively lower operating voltage, can be improved.

The present invention fabricates transistor devices with varied gate dielectric thicknesses in a number of suitable methods and variations thereof. In one example, a dielectric layer is formed on a substrate in a core region and a periphery region. The dielectric layer can be comprised of silicon dioxide or a high-k dielectric material. In such an example, transistor devices within the core region are to operate at a relatively low voltage whereas transistor devices within the periphery region are to operate at a relatively high voltage. A portion of the dielectric layer is removed from the core region and a high-k dielectric layer is then formed over the device in both the core region and the periphery region, wherein the high-k dielectric layer overlies the initial dielectric layer in the periphery region. As a result, thicknesses, including equivalent oxide thicknesses, of gate dielectrics in the core region and the periphery region are distinct. Gate electrodes are then formed over the dielectric layers in both regions and standard fabrication can be performed.

FIG. 1 is an exemplary block diagram of a semiconductor device in accordance with an aspect of the present invention. The device includes a core region 102 and a periphery region 104. The core region 102 includes transistor devices that operate at a relatively low voltage (e.g., 1 volt), whereas the periphery region includes transistor devices, such as input/output (IO) devices, that operate at a relatively high voltage (e.g., 1.5, 2.5, 3.3 volts). Other suitable operating voltages can be employed as well as other types of regions. Accordingly, the present invention is not limited to a core region and/or a. periphery region and can include other types of regions as well as other types of operating voltages. The transistor devices of both the core region 102 and the periphery region 104 have dielectric layers in their gate structures that at least partially include high-k dielectric material.

Generally, in transistor devices, a source and drain are typically formed by adding dopants to targeted regions of a semiconductor substrate or body on either side of a channel. A gate structure is formed above the channel, having a gate dielectric or dielectric layer formed over the channel and a gate electrode above the gate dielectric. The gate dielectric is an insulator material, which prevents large currents from flowing into the channel when a voltage is applied to the gate electrode, while allowing such an applied gate voltage, also referred to as an operating voltage, to set up an electric field in the channel region in a controllable manner.

A thickness of the dielectric layer is determined by, among other things, the operating voltage and a desired speed of operation. Generally, a higher operating voltage requires a thicker dielectric layer. However, faster speed of operation requires a thinner dielectric layer. Accordingly, both factors can be at odds with each other.

One dielectric material that is employed in transistor devices is silicon dioxide ($SiO_2$), which is typically formed over a silicon wafer surface. However, other dielectric materials, referred to as high-k dielectric materials can be employed to attain an equivalent oxide thickness that is smaller than its actual thickness. This is due to the dielectric constant for high-k dielectric materials being larger than the dielectric constant of silicon dioxide, which is about 3.9.

Some semiconductor devices are fabricated with transistor devices that operate at different operating voltages. The present invention facilitates fabrication of such semiconductor devices and forms the transistor devices thereon with dielectric layers comprised at least partially of high-k dielectric material.

Figure 2:
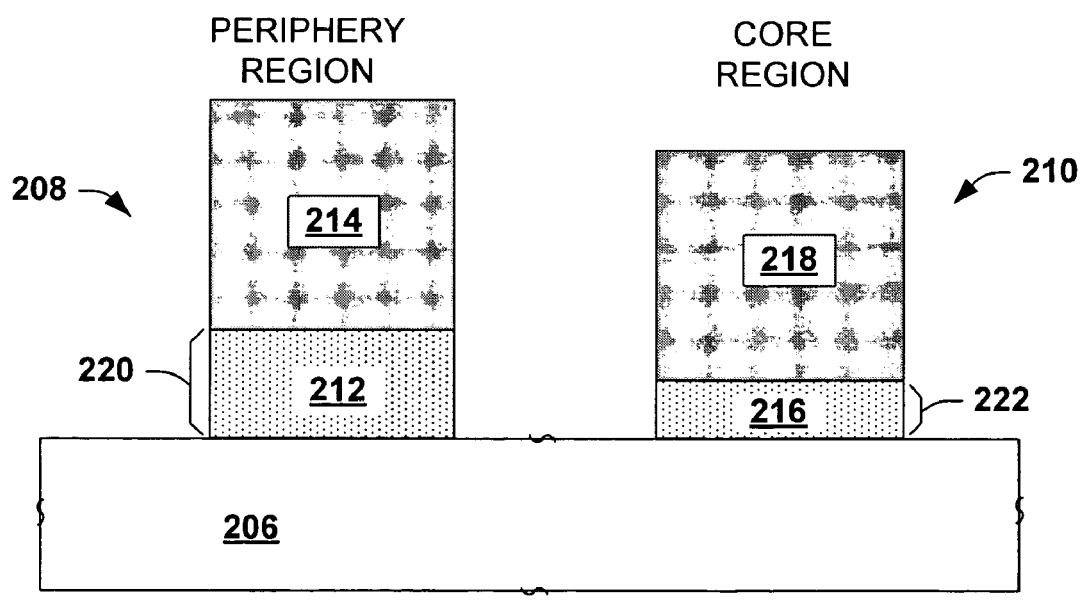
FIG. 2 is a cross sectional view illustrating high and low operating voltage transistor devices in accordance with an aspect of the present invention.

Turning now to FIG. 2, a cross sectional view illustrating high and low operating voltage transistor devices in accordance with an aspect of the present invention is presented. The view provided is somewhat simplified to further illustrate and compare thicknesses of dielectric layers in core and periphery regions.

A high voltage transistor device 208 is located within a periphery region and a low voltage transistor device 210 is located within a core region. The high voltage transistor device 208 has a relatively high operational voltage or applied voltage (e.g., 1.5 volts or more) whereas the low voltage transistor device 210 has a relatively low operational voltage or applied voltage (e.g., 1.0 volts).

The high voltage transistor device 208 includes a dielectric layer 212 and a gate 214. The dielectric layer 212 is comprised of a dielectric material, such as silicon dioxide, hafnium silicon oxynitride, or another suitable high-k dielectric material and has a first thickness 220, which is related to the device's operating voltage. The gate 214 is comprised of an electrode material such as polysilicon or a metal and is formed on the dielectric layer 212.

The low voltage transistor device 210 also includes a dielectric layer 216 and a gate 218. Again, the dielectric layer 216 is comprised of a dielectric material, such as silicon dioxide, hafnium silicon oxynitride, or another suitable high-k dielectric material, but has a second thickness 222, which is related to the device's operating voltage. The gate 218 is comprised of an electrode material such as polysilicon or a metal and is formed on the dielectric layer 216. Such gate is typically, but need not be the same material (and thickness) as the gate 214 for the periphery region device 208.

The high voltage transistor device 208 operates at a higher operating voltage (e.g., the gate voltage) than the low voltage transistor device 210. As a result, the high voltage transistor device 208 requires a thicker dielectric layer. Accordingly, the thickness (EOT) of the dielectric layer 212 for the high voltage transistor device 208, the first thickness 220, is greater than the thickness (EOT) of the dielectric layer 216 for the low voltage transistor device 210, the second thickness 222.

By permitting the dielectric layer 216 of the low voltage transistor 210 to have a distinct thickness, the low voltage transistor device 210 can operate at higher speeds than conventionally formed devices with thicker dielectric layers.

While, for purposes of simplicity of explanation, the methodology of FIG. 3, described below, is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention. In addition the method described herein can be performed multiple times to create circuits with MOS devices with greater than 2 gate dielectric thicknesses.

Figure 3:
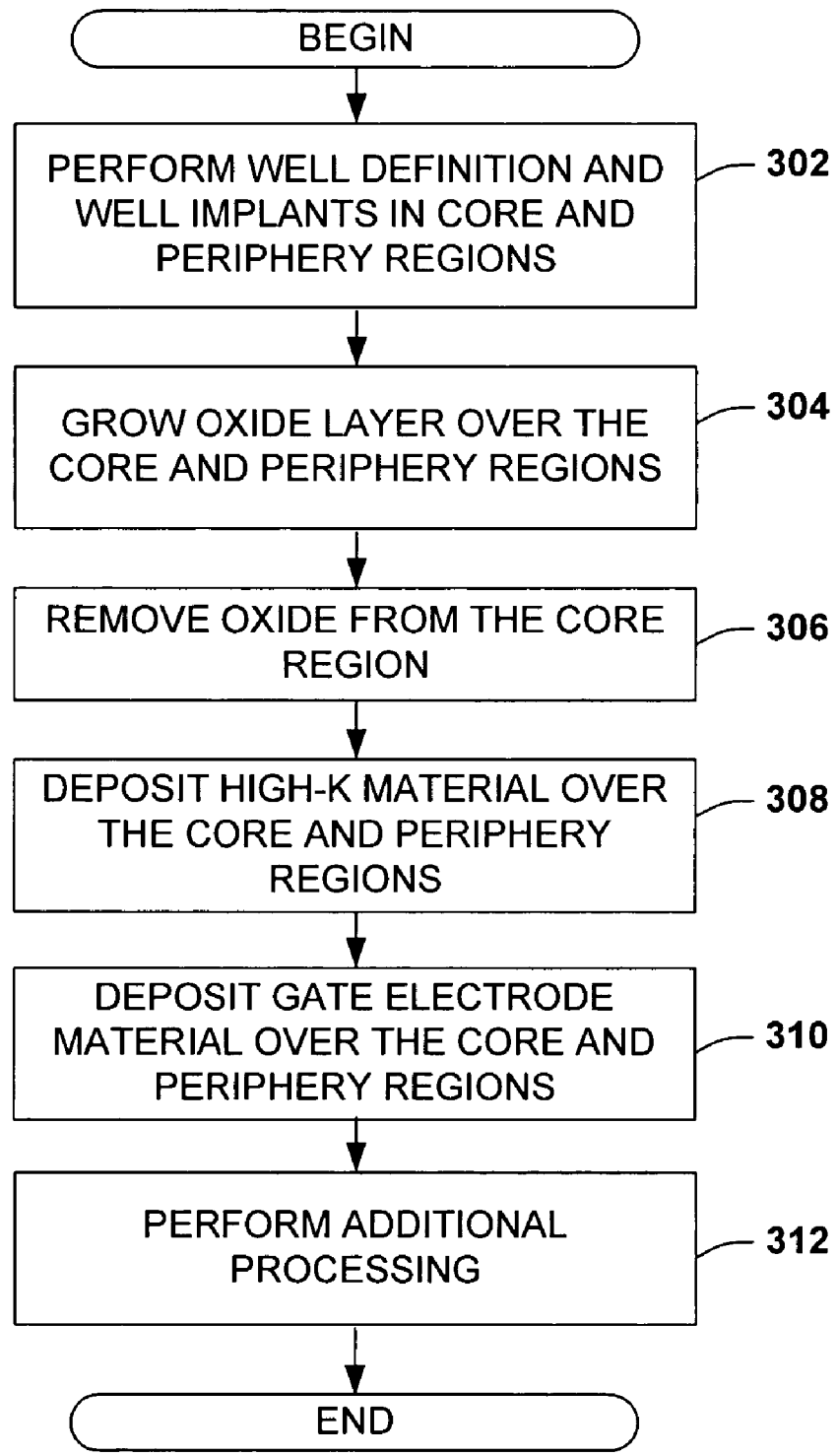
FIG. 3 is a flow diagram illustrating a method of fabricating a semiconductor device with a core region and a periphery region in which transistor devices are at least partially formed with a high-k dielectric material in accordance with an aspect of the present invention.

FIG. 3 is a flow diagram illustrating a method of fabricating a semiconductor device with a core region and a periphery region in which transistor devices are at least partially formed with a high-k dielectric material in accordance with an aspect of the present invention. Devices within the core region generally operate at a relatively low gate voltage and devices within the periphery region generally operate at a relatively high voltage (e.g., input/output devices). The method fabricates transistor devices within the core region that have a single layer high-k dielectric layer and transistor devices within the periphery region that have a composite dielectric layer comprised of a silicon dioxide layer and a high-k dielectric layer.

FIGS. 4A, 4B, 4C, and 4D are provided and described in conjunction with the method of FIG. 3. FIGS. 4A, 4B, 4C, and 4D illustrate an exemplary semiconductor device at various stages of the method. However, it is appreciated that other semiconductor devices can be fabricated by the method of FIG. 3 that deviate from the semiconductor device of FIGS. 4A, 4B, 4C, and 4D and still be in accordance with the present invention.

Beginning at block 302, well definition (e.g., isolation processing) and well implants are performed in a core region and a periphery region of a semiconductor substrate or body. The core region is designed and designated for relatively low voltage transistor devices whereas the periphery region is designed and designated for relatively high voltage transistor devices. Although the terms periphery and core in some cases connote a location, it should be understood that in accordance with the present invention, periphery refers to high operating voltage regions anywhere on the die while core refers to low operating voltage regions anywhere on the die.

Figure 4A:
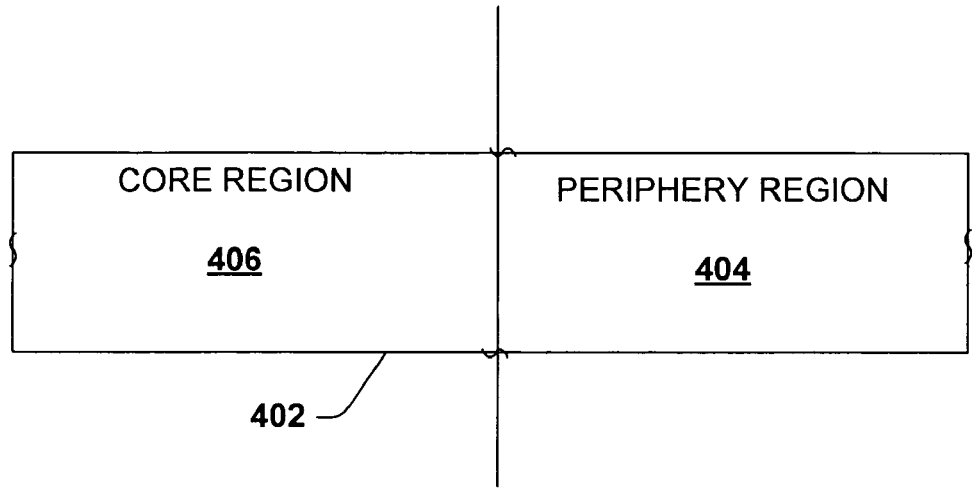
FIG. 4A is a cross sectional view of an exemplary semiconductor device after well definition and well implants have been performed in accordance with an aspect of the present invention.

FIG. 4A is a cross sectional view of an exemplary semiconductor device after well definition and well implants have been performed according to block 302 in accordance with an aspect of the present invention. A semiconductor substrate or body 402 is shown with a defined core region 406 and a defined periphery region 404.

A silicon dioxide layer is grown thermally with a first thickness over the substrate in the core and periphery regions at block 304. The first thickness is typically about 10 to 50 Angstroms and is selected according to an operating voltage for the periphery region. As will be further appreciated below, since a subsequent high-k deposition has a thickness dictated by the core device voltage requirements, the thickness of the oxide is such that it, combined with the high-k layer, yields proper performance for the periphery voltage devices. Other suitable thicknesses can also be used in accordance with the present invention.

Figure 4B:
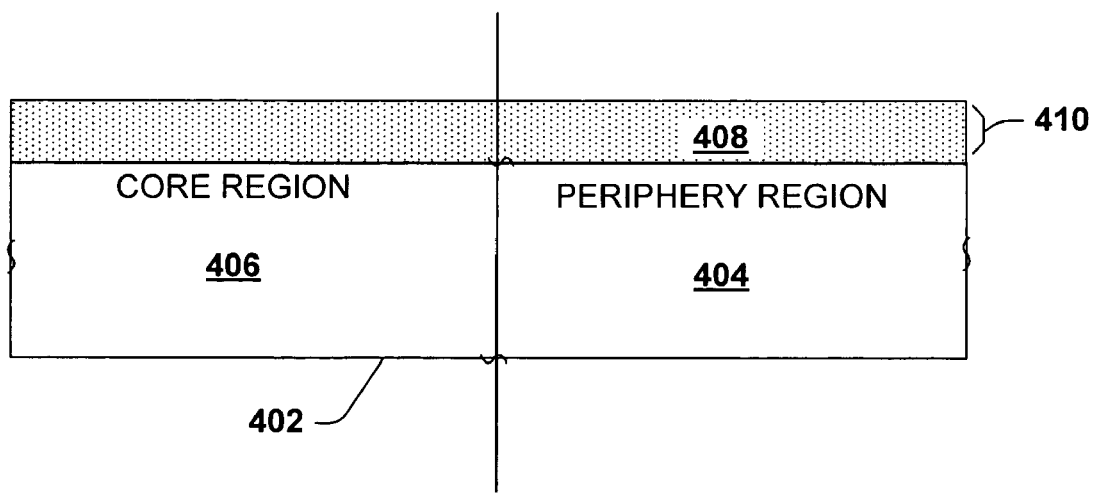
FIG. 4B is a cross sectional view of the exemplary semiconductor device after forming a silicon dioxide layer on the device in accordance with an aspect of the present invention.

FIG. 4B is a cross sectional view of the exemplary semiconductor device after forming a silicon dioxide layer 408 on the device in accordance with an aspect of the present invention. As can be seen, the silicon dioxide layer 408 is grown in both the core region 406 and the periphery region 404 and has a first thickness 410.

Subsequently, a photoresist mask is applied over the periphery region and the silicon dioxide layer is removed from the core region while leaving the silicon dioxide layer within the periphery region at block 306. A suitable wet etch process, such as a buffered HF process, can be employed to selectively remove the silicon dioxide from the core region.

Figure 4C:
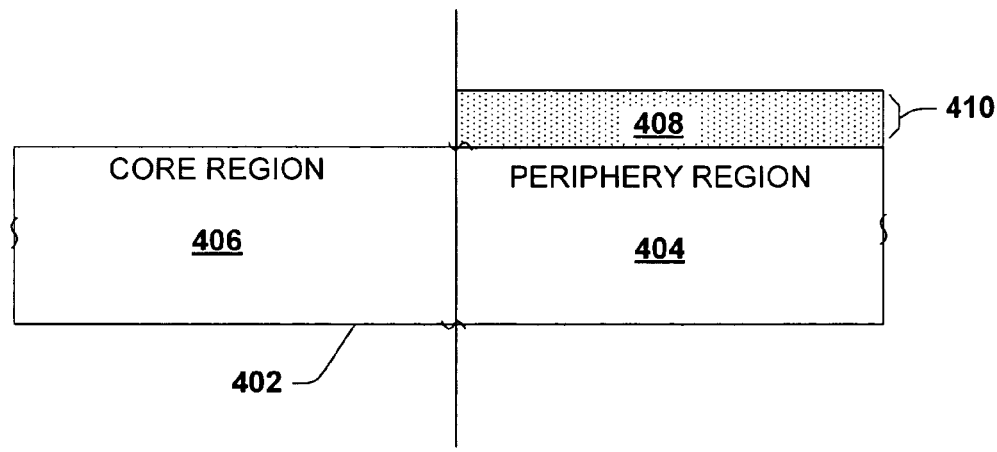
FIG. 4C is a cross sectional view of the exemplary semiconductor device after selectively removing grown silicon dioxide from the core region in accordance with an aspect of the present invention.

FIG. 4C is a cross sectional view of the exemplary semiconductor device after selectively removing grown silicon dioxide from the core region at block 306 in accordance with an aspect of the present invention. The silicon dioxide layer 408 is now only present within the periphery region 404.

The photoresist mask is removed and a high-k dielectric layer with a second thickness is deposited over the device at block 308. The second thickness is selected to provide a suitable equivalent oxide thickness (EOT) for transistor devices within the core region to operate at a relatively low voltage. As discussed above, the second thickness of the high-k dielectric layer combines with the first thickness of the silicon dioxide layer to permit operation of high voltage transistors within the periphery region. Thus, the second thickness is a function of the operating voltage of transistor devices within the core region and the combined thickness of the second thickness and the first thickness is a function of the operating voltage of transistor devices within the periphery region.

Prior to deposition of the high-k dielectric material, a suitable surface preparation is performed. The surface preparation step might include the growth of an ultra-thin silicon dioxide layer with a thickness of one to six monolayers. Unlike $SiO_2$, which may be formed by thermal oxidation (growth process), the high-k dielectric layer is formed by depositing a high-k dielectric material over the semiconductor substrate, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the dielectric layer in the core region. High-k dielectric materials have dielectric constants that are greater than that of $SiO_2$ (e.g., greater than about 3.9). As a result, the high-k dielectric layer can be formed in a thicker layer than scaled $SiO_2$, and yet produce equivalent field effect performance. The relative electrical performance of such high-k dielectric materials is often expressed as EOT, because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Any suitable dielectric may be deposited at block 308 having a dielectric constant higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

A multi-step annealing process can, optionally, be performed to facilitate the performance and operation of the dielectric layer and the transistor devices that employ the layer. The deposited high-k dielectric layer can be subjected to one or more non-oxidizing anneals to densify the dielectric material and one or more oxidizing anneals to mitigate material defects. Additionally, the dielectric layer may be nitrided to inhibit dopant diffusion and to thermally stabilize the deposited dielectric material.

An example of a suitable multi-step anneal process that can be employed with the method of FIG. 3 follows. A multi-step process is performed including one or more pre-nitridation anneals, a nitridation process, and one or more post-nitridation anneals. The multi-step process may advantageously comprise first and second pre-nitridation anneals, wherein a first anneal is performed at a moderate temperature in an inert non-oxidizing ambient for densifying the deposited high-k material, as well as a second pre-nitridation anneal that is performed in an oxidizing ambient for curing defects and eliminating impurities. Moreover, the post-nitridation annealing can advantageously include a third anneal performed at a high temperature in a non-oxidizing ambient to densify the thermally stabilized high-k material and a fourth anneal in an oxidizing ambient to reduce any remaining defects and impurities.

Figure 4D:
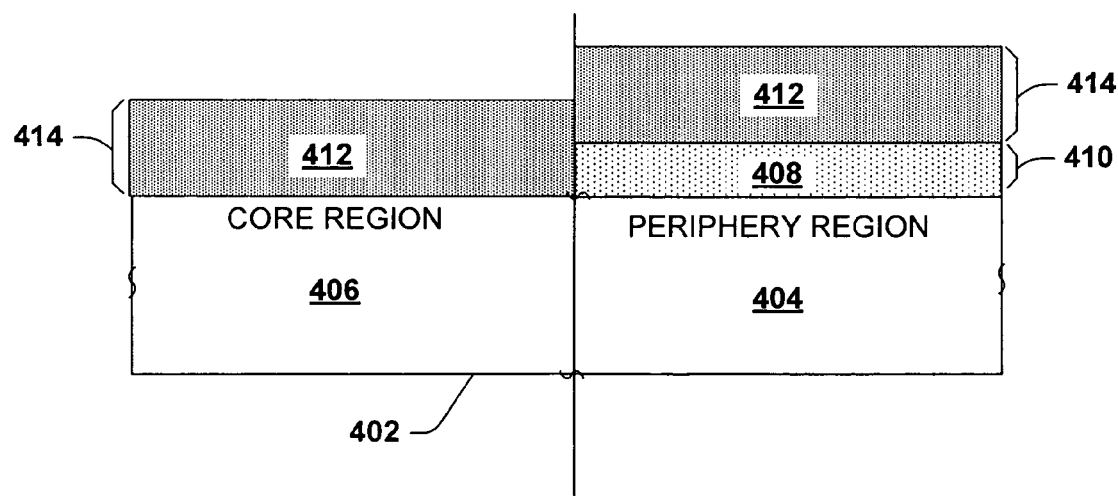
FIG. 4D is a cross sectional view of the exemplary semiconductor device after depositing high-k dielectric material over the device in accordance with an aspect of the present invention.

FIG. 4D is a cross sectional view of the exemplary semiconductor device after depositing the high-k dielectric material over the device at block 308 in accordance with an aspect of the present invention. The silicon dioxide layer 408 is still only present within the periphery region 404, but a high-k dielectric layer 412 with a second thickness 414 is present in both the core region 406 and the periphery region 404. Within the periphery region, the silicon dioxide layer 408 and the high-k dielectric layer 412 operate as a combined dielectric with a combined EOT equal to an EOT of the silicon dioxide layer 408 and an EOT of the high-k dielectric layer 412.

Continuing with the method of FIG. 3, a gate electrode material is then deposited over the device at block 310 and is then patterned to form gates on the device. The deposited electrode material is a suitable conductive, electrode material including, but not limited to, polysilicon, metals, metal silicides, metal oxides, metal nitrides, or stacks combinations thereof. A suitable deposition process, such as CVD, PVD, and ALD, is employed to deposit the electrode material. Additionally, the material can be doped or undoped.

Additional processing, including source/drain implants, extension region implant, spacer formation, silicidation, interconnect formation, and the like can then be performed at block 312 to complete fabrication of the semiconductor device.

While, for purposes of simplicity of explanation, the methodology of FIG. 5, described below, is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention. In addition the method described herein can be performed multiple times to create circuits with MOS devices with greater than 2 gate dielectric thicknesses.

Figure 5:
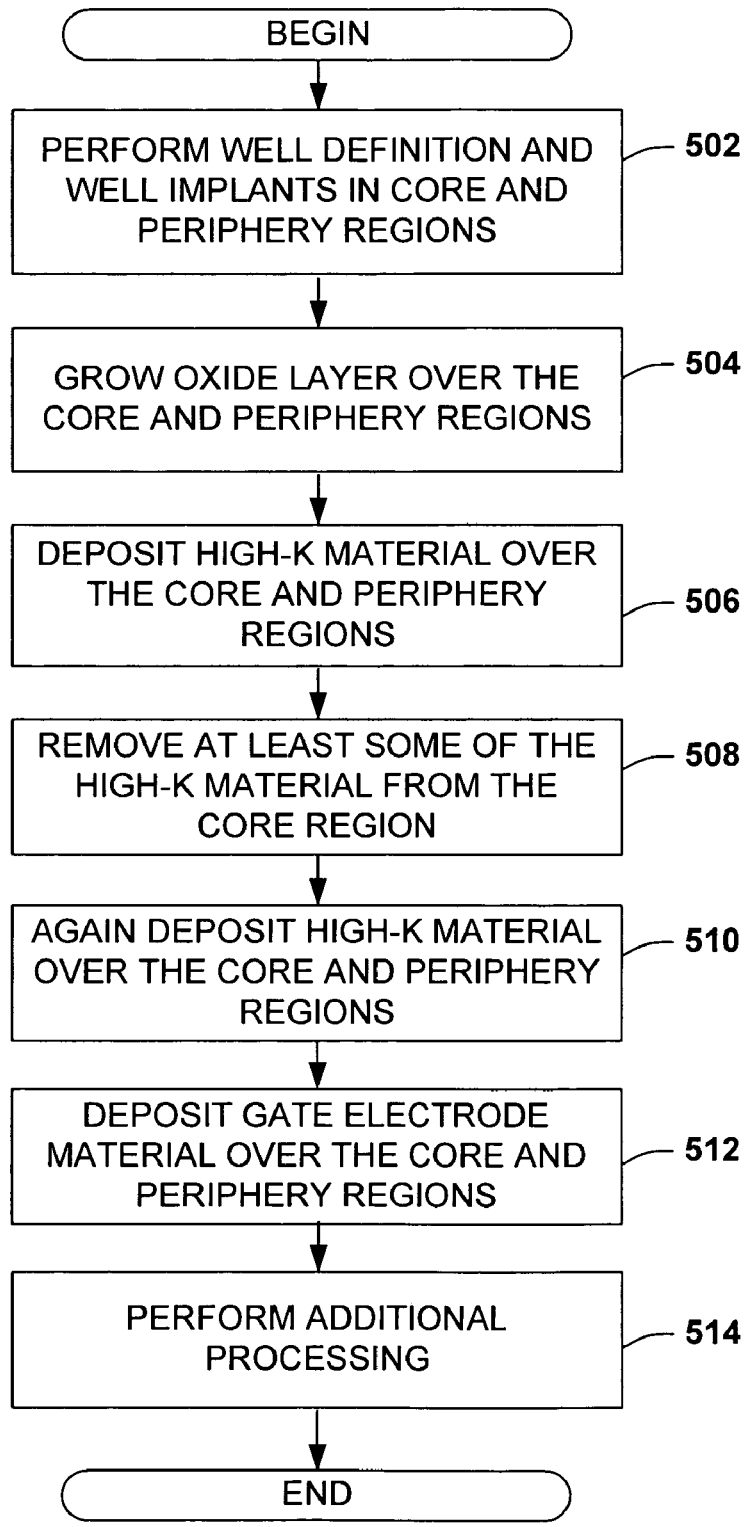
FIG. 5 is a flow diagram illustrating a method of fabricating a semiconductor device with a core region and a periphery region in which transistor devices are at least partially formed with a high-k dielectric material in accordance with an aspect of the present invention.

FIG. 5 is a flow diagram illustrating a method of fabricating a semiconductor device with a core region and a periphery region in which transistor devices are at least partially formed with a high-k dielectric material in accordance with an aspect of the present invention. Devices within the core region generally operate at a relatively low gate voltage and devices within the periphery region generally operate at a relatively high voltage (e.g., input/output devices). The method fabricates transistor devices within the core region that have a composite dielectric layer comprised of a single high-k layer on a silicon dioxide layer and transistor devices within the periphery region that have a composite dielectric layer comprised of a silicon dioxide layer and a multi-layer high-k dielectric layer.

FIGS. 6A, 6B, 6C, 6D, and 6E are provided and described in conjunction with the method of FIG. 5. FIGS. 6A, 6B, 6C, 6D, and 6E illustrate an exemplary semiconductor device at various stages of the method. However, it is appreciated that other semiconductor devices can be fabricated by the method of FIG. 5 that deviate from the semiconductor device of FIGS. 6A, 6B, 6C, 6D, and 6E and still be in accordance with the present invention.

Beginning at block 502, well definition and well implants are performed in a core region and a periphery region of a semiconductor substrate or body. The core region is designed and designated for relatively low voltage transistor devices whereas the periphery region is designed and designated for relatively high voltage transistor devices.

Figure 6A:
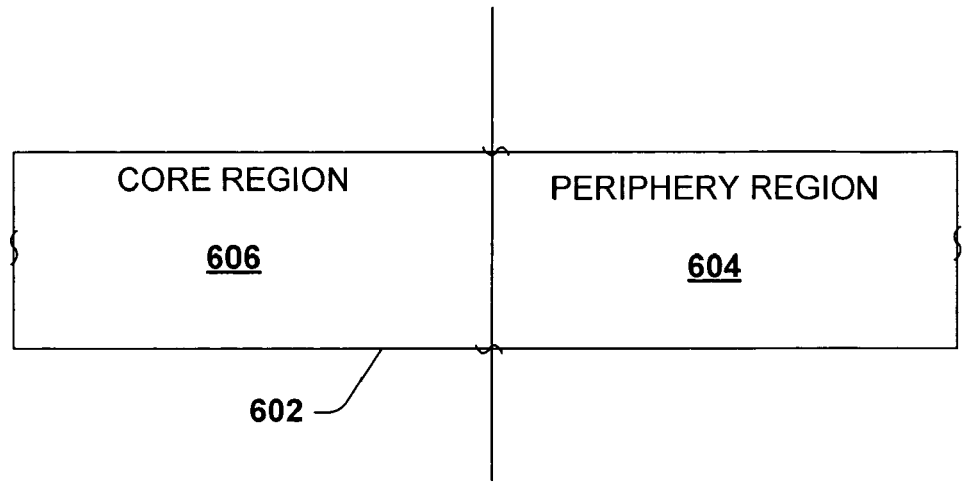
FIG. 6A is a cross sectional view of an exemplary semiconductor device after well definition and well implants have been performed in accordance with an aspect of the present invention.

FIG. 6A is a cross sectional view of an exemplary semiconductor device after well definition and well implants have been performed according to block 502 in accordance with an aspect of the present invention. A semiconductor substrate or body 602 is shown with a defined core region 606 and a defined periphery region 604.

A silicon dioxide layer is grown thermally with a first thickness over the substrate in the core and periphery regions at block 504. The first thickness is typically about 10 to 50 Angstroms and is selected according to an operating voltage for the core region. Other suitable thicknesses can also be used in accordance with the present invention.

Figure 6B:
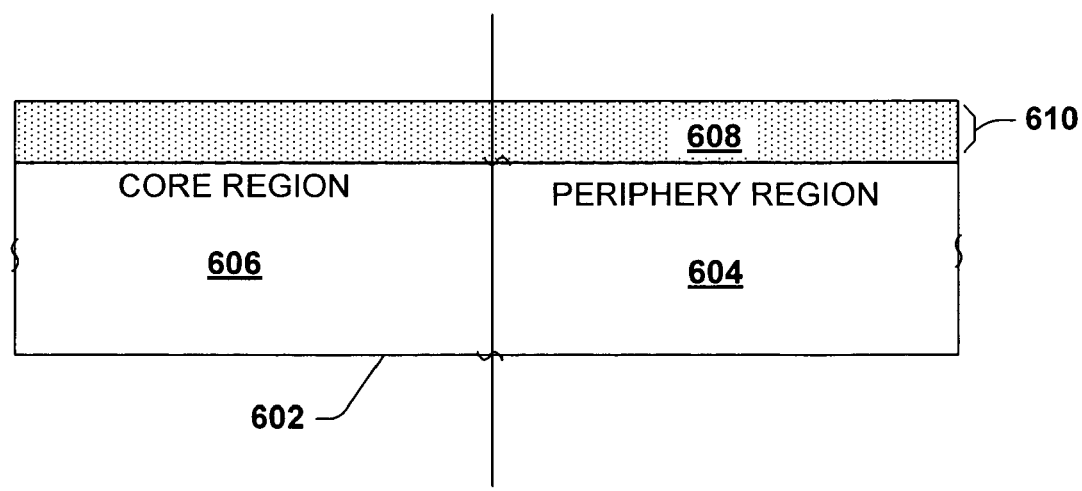
FIG. 6B is a cross sectional view of the exemplary semiconductor device after forming a silicon dioxide layer on the device in accordance with an aspect of the present invention.

FIG. 6B is a cross sectional view of the exemplary semiconductor device after forming a silicon dioxide layer 608 on the device in accordance with an aspect of the present invention. As can be seen, the silicon dioxide layer 608 is grown in both the core region 606 and the periphery region 604 and has a first thickness 610.

A high-k dielectric layer with a second thickness is deposited over the device at block 506. The second thickness is selected to provide a suitable equivalent oxide thickness (EOT) for transistor devices within the periphery region to operate at a relatively high voltage. The second thickness of the high-k dielectric layer combines with the first thickness of the silicon dioxide layer (and with another, as will be discussed infra) to permit operation of high voltage transistors within the periphery region. Thus, the second thickness is a function of the combined thickness of the second thickness and the first thickness is a function of the operating voltage of transistor devices within the periphery region.

Unlike $SiO_2$, which may be formed by thermal oxidation (growth process), the high-k dielectric layer is formed by depositing a high-k dielectric material over the semiconductor substrate, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the high-k dielectric layer. High-k dielectric materials have dielectric constants that are greater than that of $SiO_2$ (e.g., greater than about 3.9). As a result, the high-k dielectric layer can be formed in a thicker layer than scaled $SiO_2$, and yet produce equivalent field effect performance. The relative electrical performance of such high-k dielectric materials is often expressed as EOT, because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Any suitable dielectric may be deposited at block 506 having a dielectric constant higher than that of $SiO_2$, including but not limited to the materials described supra.

Figure 6C:
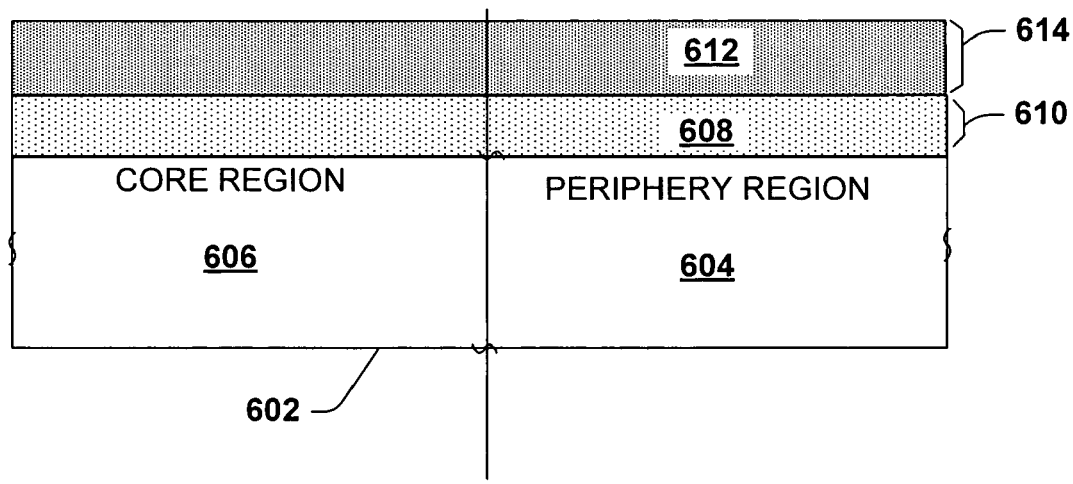
FIG. 6C is a cross sectional view of the exemplary semiconductor device after depositing high-k dielectric material over the device in accordance with an aspect of the present invention.

FIG. 6C is a cross sectional view of the exemplary semiconductor device after depositing high-k dielectric material over the device at block 506 in accordance with an aspect of the present invention. The silicon dioxide layer 608 and a high-k dielectric layer 612 with a second thickness 614 are present in both the core region 606 and the periphery region 604.

Subsequently, a photoresist mask is applied over the periphery region and at least a portion of the high-k dielectric layer is removed from the core region at block 508. A suitable wet etch process, such as a buffered HF process, can be employed to selectively remove the dielectric material from the core region. Furthermore, the initial silicon dioxide layer can be employed as an etch stop in removing the high-k dielectric material from the core region.

Figure 6D:
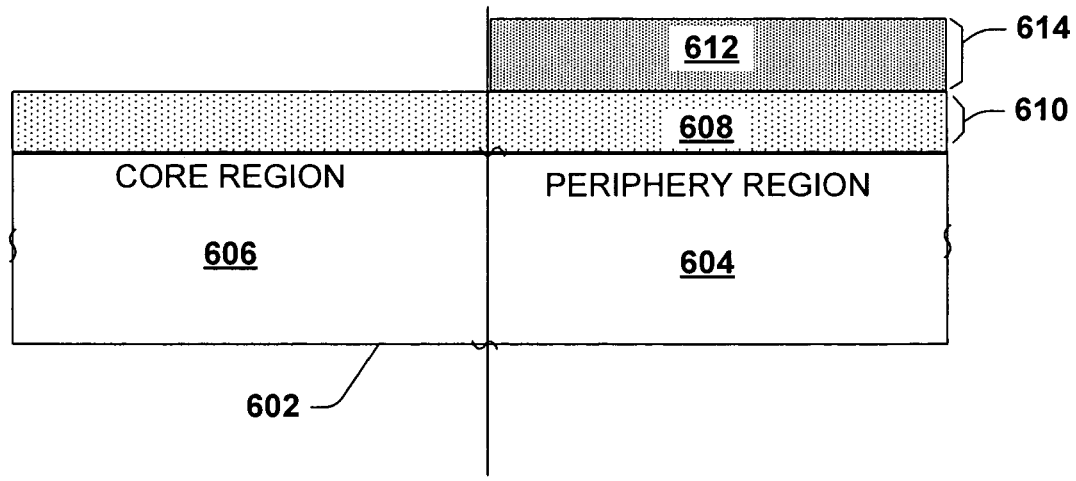
FIG. 6D is a cross sectional view of the exemplary semiconductor device after selectively removing at least a portion of the high-k dielectric layer from the core region in accordance with an aspect of the present invention.

FIG. 6D is a cross sectional view of the exemplary semiconductor device after selectively removing at least a portion of the high-k dielectric layer 612 from the core region at block 508 in accordance with an aspect of the present invention. The high-k dielectric layer 612 is now only substantially present within the periphery region 604.

A second high-k dielectric layer with a third thickness is deposited over the device at block 510. The second high-k dielectric layer is formed by depositing a high-k dielectric material over the semiconductor substrate, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the high-k dielectric layer. The second high-k dielectric layer can have any suitable thickness, but is typically within the range of 1 monolayer to about 50 Angstroms.

A multi-step annealing process can also be performed to facilitate the performance and operation of the dielectric layer and the transistor devices that employ the layer. The deposited high-k dielectric layers can be subjected to one or more non-oxidizing anneals to densify the dielectric material and one or more oxidizing anneals to mitigate material defects. Additionally, the dielectric layers may be nitrided to inhibit dopant diffusion and to thermally stabilize the deposited dielectric material. A suitable exemplary multi-step anneal process is described with respect to FIG. 3.

Figure 6E:
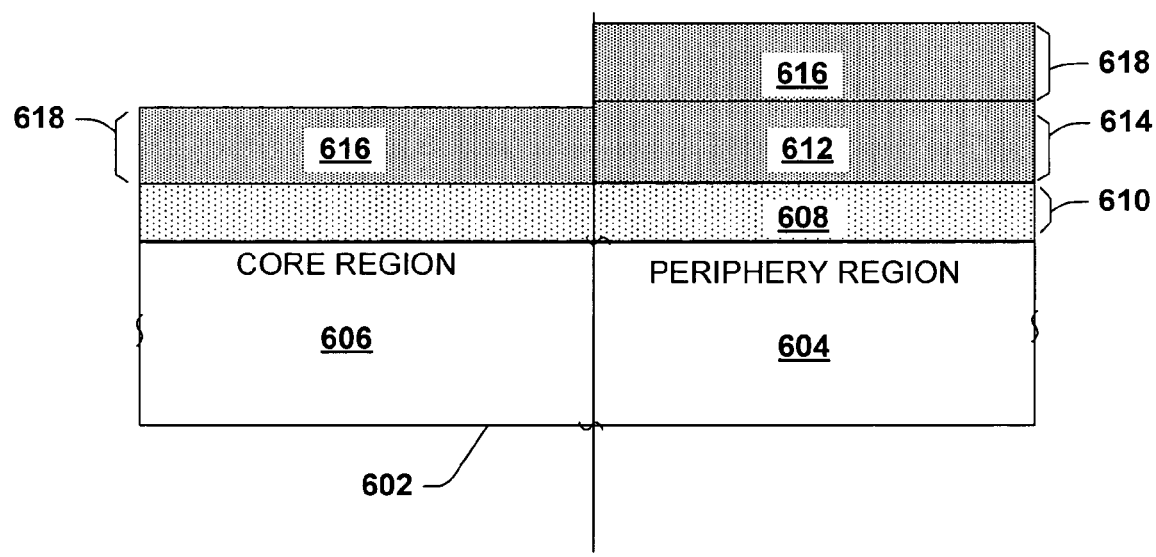
FIG. 6E is a cross sectional view of the exemplary semiconductor device after depositing additional high-k dielectric material over the device in accordance with an aspect of the present invention.

FIG. 6E is a cross sectional view of the exemplary semiconductor device after depositing additional high-k dielectric material over the device at block 506 in accordance with an aspect of the present invention. The silicon dioxide layer 608 and the second high-k dielectric layer 616 with a third thickness 618 are present in both the core region 606 and the periphery region 604. Within the periphery region, the silicon dioxide layer 608, the high-k dielectric layer 612, and the second high-k dielectric layer 616 operate as a combined dielectric with a combined EOT equal to an EOT of the silicon dioxide layer 608, an EOT of the high-k dielectric layer 612, and an EOT of the second high-k dielectric layer 616. Accordingly, the first thickness 610 and the third thickness 618 are selected as a function of the relatively low operating voltage(s) of the core region and the first thickness 610, the second thickness 614, and the third thickness 618 are selected as a function of the relatively high operating voltage(s) of the periphery region. Thus the thickness 614 of the first high-k layer 612 is tailored to obtain the desired transistor performance in the periphery region.

Continuing with the method of FIG. 5, a gate electrode material is then deposited over the device at block 512 and is then patterned to form gates on the device. The deposited electrode material is a suitable conductive, electrode material including, but not limited to, polysilicon, metals, metal silicides, metal oxides, metal nitrides, or stacks combinations thereof. A suitable deposition process, such as CVD, PVD, and ALD, is employed to deposit the electrode material. Additionally, the material can be doped or undoped.

Additional processing, including source/drain implants, extension region implant, spacer formation, silicidation, interconnect formation, and the like can then be performed at block 514 to complete fabrication of the semiconductor device.

While, for purposes of simplicity of explanation, the methodology of FIG. 7, described below, is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention. In addition the method described herein can be performed multiple times to create circuits with MOS devices with greater than 2 gate dielectric thicknesses.

Figure 7:
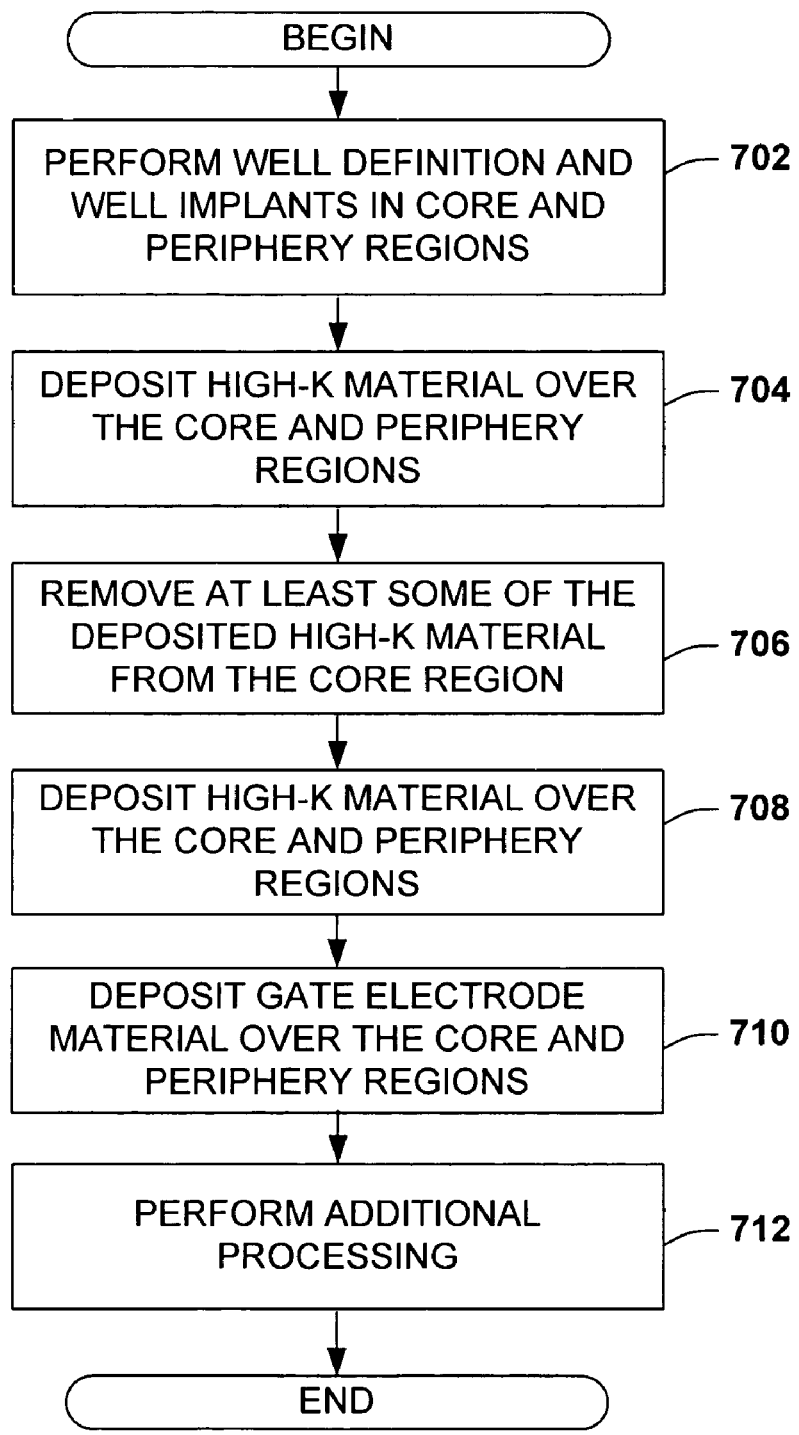
FIG. 7 is a flow diagram illustrating a method of fabricating a semiconductor device with a core region and a periphery region in which transistor devices are at least partially formed with a high-k dielectric material in accordance with an aspect of the present invention.

FIG. 7 is a flow diagram illustrating a method of fabricating a semiconductor device with a core region and a periphery region in which transistor devices are at least partially formed with a high-k dielectric material in accordance with an aspect of the present invention. Devices within the core region generally operate at a relatively low voltage and devices within the periphery region generally operate at a relatively high voltage (e.g., input/output devices). The method fabricates transistor devices within the core region that have a single layered high-k dielectric layer and transistor devices within the periphery region that have a composite dielectric layer comprised of multiple high-k dielectric layers.

FIGS. 8A, 8B, 8C, and 8D are provided and described in conjunction with the method of FIG. 7. FIGS. 8A, 8B, 8C, and 8D illustrate an exemplary semiconductor device at various stages of the method. However, it is appreciated that other semiconductor devices can be fabricated by the method of FIG. 7 that deviate from the semiconductor device of FIGS. 8A, 8B, 8C, and 8D and still be in accordance with the present invention.

Beginning at block 702, well definition and well implants are performed in a core region and a periphery region of a semiconductor substrate or body. The core region is designed and designated for relatively low voltage transistor devices whereas the periphery region is designed and designated for relatively high voltage transistor devices.

Figure 8A:
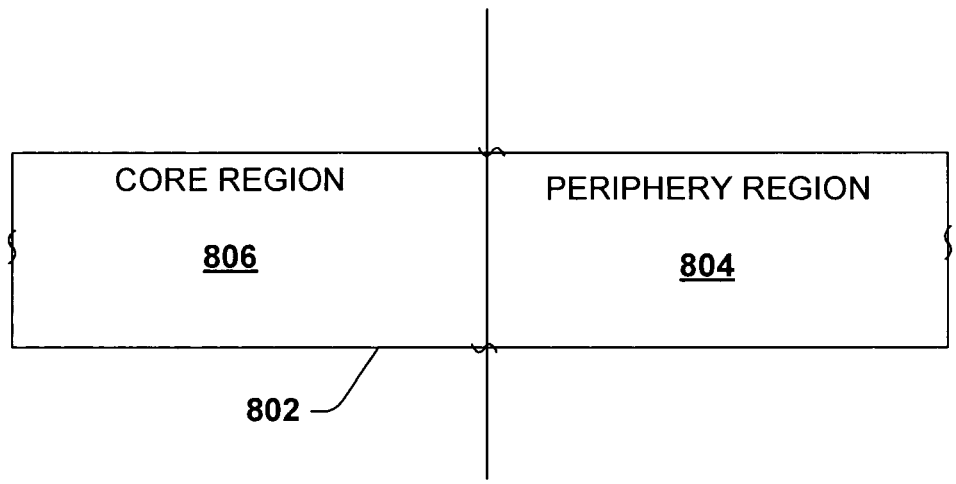
FIG. 8A is a cross sectional view of an exemplary semiconductor device after well definition and well implants have been performed in accordance with an aspect of the present invention.

FIG. 8A is a cross sectional view of an exemplary semiconductor device after well definition and well implants have been performed according to block 702 in accordance with an aspect of the present invention. A semiconductor substrate or body 802 is shown with a defined core region 806 and a defined periphery region 804.

A first high-k dielectric layer is formed over the device with a first thickness by depositing a high-k dielectric material over the substrate in the core and periphery regions at block 704. The first thickness is typically about 15 to 50 Angstroms and is selected according to an operating voltage for the periphery region. Other suitable thicknesses can also be employed in accordance with the present invention.

Figure 8B:
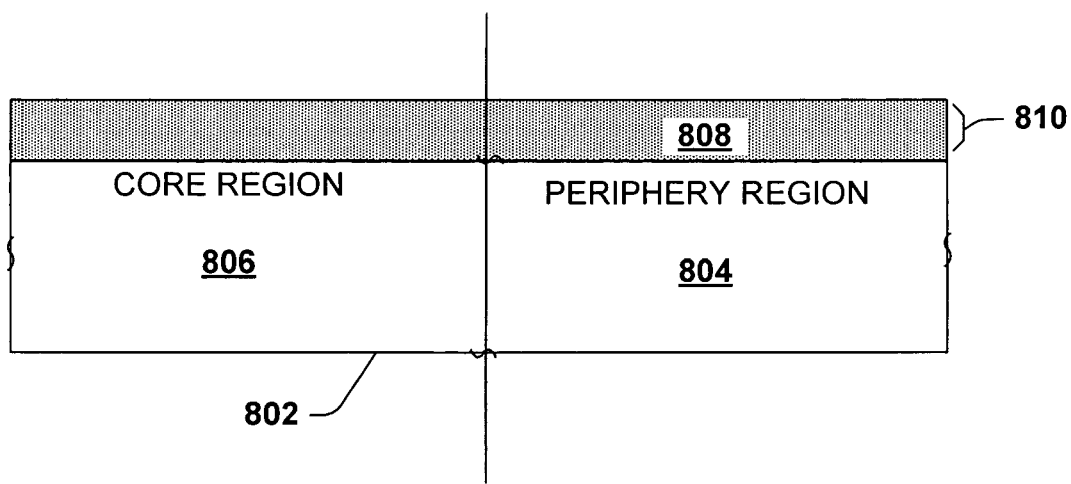
FIG. 8B is a cross sectional view of the exemplary semiconductor device after forming a first high-k dielectric layer on the device in accordance with an aspect of the present invention.

FIG. 8B is a cross sectional view of the exemplary semiconductor device after forming a first high-k dielectric layer 808 on the device in accordance with an aspect of the present invention. As can be seen, the first high-k dielectric layer 808 is formed in both the core region 806 and the periphery region 804 and has a first thickness 810.

Prior to deposition of the high-k dielectric material, a suitable surface preparation can be performed. Unlike $SiO_2$, which may be formed by thermal oxidation (growth process), the high-k dielectric layer is formed by depositing a high-k dielectric material over the semiconductor substrate, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the dielectric layer. High-k dielectric materials have dielectric constants that are greater than that of $SiO_2$ (e.g., greater than about 3.9). As a result, the high-k dielectric layer can be formed in a thicker layer than scaled $SiO_2$, and yet produce equivalent field effect performance. The relative electrical performance of such high-k dielectric materials is often expressed as EOT, because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Any suitable dielectric may be deposited at block 704 having a dielectric constant higher than that of $SiO_2$, for example, materials discussed supra.

Subsequently, a photoresist mask is applied and the first high-k dielectric layer is removed from the core region while leaving the layer within in the periphery region at block 706. A suitable wet etch process, such as a buffered HF process, can be employed to selectively remove the high-k dielectric material from the core region.

Figure 8C:
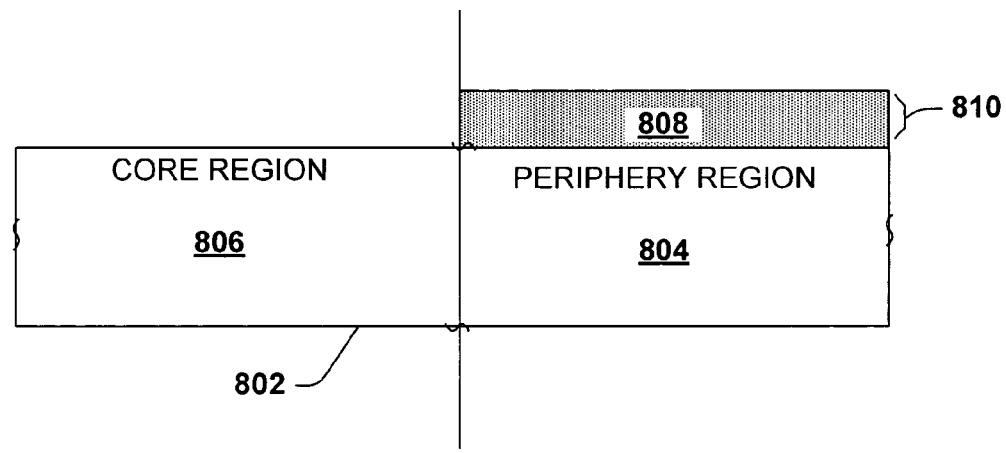
FIG. 8C is a cross sectional view of the exemplary semiconductor device after selectively removing high-k dielectric material from the core region in accordance with an aspect of the present invention.

FIG. 8C is a cross sectional view of the exemplary semiconductor device after selectively removing high-k dielectric material from the core region at block 706 in accordance with an aspect of the present invention. The high-k dielectric layer 808 is now only present within the periphery region 804.

Continuing on with the method of FIG. 7, a second high-k dielectric layer is then formed over the device with a second thickness by depositing additional high-k dielectric material over the substrate in the core and periphery regions at block 708. The second thickness is typically about 10 to 40 Angstroms and is selected according to an operating voltage for the core region. Other suitable thicknesses can be employed in accordance with the present invention. Suitable deposition processes and high-k dielectric materials are described supra.

Figure 8D:
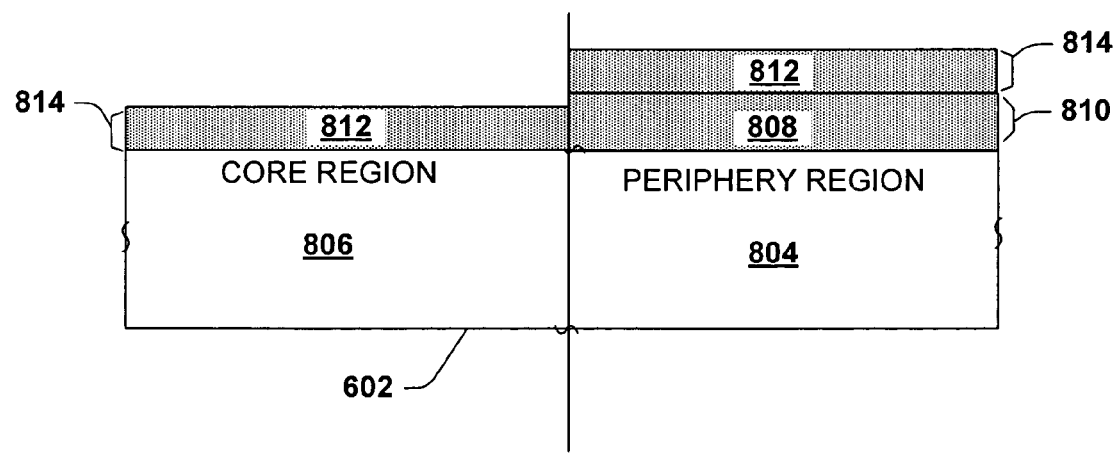
FIG. 8D is a cross sectional view of the exemplary semiconductor device after forming a second high-k dielectric layer over the substrate within the core region and the periphery region in accordance with an aspect of the present invention.

FIG. 8D is a cross sectional view of the exemplary semiconductor device after forming a second high-k dielectric layer 812 over the substrate within the core region and the periphery region at block 708 in accordance with an aspect of the present invention. The second high-k dielectric layer 812 is present within the core region 804 and the periphery region 806, whereas the first high-k dielectric layer 808 is present only within the periphery region 806. The second high-k dielectric layer is shown with a second thickness 814.

The second thickness of the second high-k dielectric layer is selected to provide a suitable equivalent oxide thickness (EOT) for transistor devices within the core region to operate at a relatively low voltage. The second thickness of the high-k dielectric layer combines with the first thickness of the first high-k dielectric layer to permit operation of high voltage transistors within the periphery region. Thus, the second thickness is a function of the operating voltage of transistor devices within the core region and the combined thickness of the second thickness and the first thickness is a function of the operating voltage of transistor devices within the periphery region.

A multi-step annealing process can, optionally, be performed to facilitate the performance and operation of the dielectric layers 808 and 812 and the transistor devices that employ the layer. The deposited high-k dielectric layer can be subjected to one or more non-oxidizing anneals to densify the dielectric material and one or more oxidizing anneals to mitigate material defects. Additionally, the dielectric layer may be nitrided to inhibit dopant diffusion and to thermally stabilize the deposited dielectric material. An exemplary multi-step process is described supra.

Continuing with the method of FIG. 7, a gate electrode material is then deposited over the device at block 710 and is then patterned to form gates on the device. The deposited electrode material is a suitable conductive, electrode material including, but not limited to, polysilicon, metals, metal silicides, metal oxides, metal nitrides, or stacks combinations thereof. A suitable deposition process, such as CVD, PVD, and ALD, is employed to deposit the electrode material. Additionally, the material can be doped or undoped.

Additional processing, including source/drain implants, extension region implant, spacer formation, silicidation, interconnect formation, and the like can then be performed at block 712 to complete fabrication of the semiconductor device.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for fabricating a semiconductor device comprising:
   forming a first dielectric layer on a semiconductor substrate within a core region and a periphery region;
   selectively removing at least a portion of the first dielectric layer from the core region;
   depositing a high-k dielectric material on the core region and the periphery region to form a high-k dielectric layer within the core region and the periphery region;
   forming gates within the core region that substantially employ the high-k dielectric layer as a gate dielectric and forming gates within the periphery region that employ the first dielectric layer and the high-k dielectric layer as a gate dielectric; and
   performing one or more anneal operations after depositing the high-k dielectric material and before forming gates.

2. The method of claim 1, wherein forming the first dielectric layer comprises growing silicon dioxide via a thermal process.

3. The method of claim 1, wherein forming the first dielectric layer comprises depositing high-k dielectric material.

4. The method of claim 1, wherein depositing the high-k material employs one of the deposition methods selected from the group comprising: chemical vapor deposition, atomic layer deposition, physical vapor deposition, and molecular beam epitaxy.

5. The method of claim 1, wherein the deposited high-k material is selected from the group comprising HfSiON, $HfO_2$, HfSiO, and HfSiN.

6. The method of claim 1, wherein selectively removing at least a portion of the first dielectric layer from the core region comprises applying a photoresist mask that exposes the core region and using a buffered HF etch process that substantially removes the first dielectric layer from the core region.

7. A method for fabricating a semiconductor device comprising:
    forming a first dielectric layer on a semiconductor substrate within a core region and a periphery region;
    selectively removing at least a portion of the first dielectric layer from the core region;
    depositing a high-k dielectric material on the core region and the periphery region to form a high-k dielectric layer within the core region and the periphery region;
    forming gates within the core region that substantially employ the high-k dielectric layer as a gate dielectric and forming gates within the periphery region that employ the first dielectric layer and the high-k dielectric layer as a gate dielectric; and
    performing one or more non-oxidizing anneals that densify at least the high-k dielectric layer and one or more oxidizing anneals that mitigate defects in at least the high-k dielectric layer after depositing the high-k dielectric material and before forming gates.

8. The method of claim 1, wherein the deposited high-k dielectric layer is formed to have a thickness according to an operating voltage of the core region.

9. The method of claim 1, wherein the deposited high-k dielectric layer is formed to have a first thickness and the first dielectric layer is formed to have a second thickness, wherein the first thickness and the second thickness combined are selected according to an operating voltage of the periphery region.

10. The method of claim 1, further comprising performing a nitridation anneal of the deposited high-k dielectric material to facilitate thermal stability and mitigate dopant diffusion.

11. A method for fabricating a semiconductor device comprising:
    growing a silicon dioxide layer on a semiconductor substrate within a core region and a periphery region;
    depositing a high-k dielectric material on the core region and the periphery region to form a first high-k dielectric layer within the core region and the periphery region;
    selectively removing at least a portion of the first high-k dielectric layer from the core region;
    depositing a high-k dielectric material on the core region and the periphery region to form a second high-k dielectric layer within the core region and the periphery region;
    forming gates within the core region that substantially employ the second high-k dielectric layer as a gate dielectric and forming gates within the periphery region that employ the first high-k dielectric layer and the second high-k dielectric layer as a gate dielectric; and
    performing one or more anneal operations to densify and mitigate defects in the first and second high-k dielectric layers before forming gates.

12. The method of claim 11, wherein the silicon dioxide layer is grown to be relatively thin.

13. The method of claim 11, wherein the silicon dioxide layer is grown to have a thickness of about 3 to 12 Angstroms.

14. The method of claim 11, wherein selectively removing at least a portion of the first high-k dielectric layer from the core region comprises employing the silicon dioxide layer as an etch stop.

15. The method of claim 11, further comprising nitriding the first and second high-k dielectric layers to facilitate thermal stability and mitigate dopant diffusion.

16. The method of claim 11, wherein the silicon dioxide layer is grown to have a first thickness and the second high-k dielectric layer is formed to have a second thickness, wherein the second thickness and the first thickness combine to provide a sufficient equivalent oxide thickness for an operating voltage of the core region.

17. The method of claim 11, wherein the silicon dioxide layer is grown to have a first thickness, the first high-k dielectric layer is formed to have a second thickness, and the second high-k dielectric layer is formed to have a third thickness, wherein the third thickness, the second thickness, and the first thickness combine to provide a sufficient equivalent oxide thickness for an operating voltage of the periphery region.

* * * * *